United States Patent [19]

Kinghorn

[11] Patent Number: 5,635,755
[45] Date of Patent: Jun. 3, 1997

[54] SOLDERABLE INTERGRATED CIRCUIT LEAD FRAMES PLATED WITH TIN AND PALLADIUM

[75] Inventor: David H. Kinghorn, Sunnyvale, Calif.

[73] Assignee: National Semiconductor Corporation, Santa Clara, Calif.

[21] Appl. No.: 671,924

[22] Filed: Jun. 27, 1996

Related U.S. Application Data

[60] Continuation of Ser. No. 413,185, Mar. 30, 1995, abandoned, which is a division of Ser. No. 260,712, Jun. 16, 1994, Pat. No. 5,454,929.

[51] Int. Cl.[6] .................. H01L 23/495; H01L 23/48; H01L 23/52
[52] U.S. Cl. .................. 257/666; 257/736; 257/750; 257/751; 257/762; 257/766; 257/768
[58] Field of Search .................. 257/666, 736, 257/750, 751, 762, 766, 781, 787, 673, 667, 768; 361/723

[56] References Cited

U.S. PATENT DOCUMENTS

| | | |
|---|---|---|
| 4,404,079 | 9/1983 | Jahani . |
| 4,404,080 | 9/1983 | Jahani . |
| 4,405,432 | 9/1983 | Kosowsky . |
| 4,486,511 | 12/1984 | Chen et al. . |
| 4,628,165 | 12/1986 | Nobel et al. . |
| 4,888,449 | 12/1989 | Crane et al. . |
| 4,954,870 | 9/1990 | Takemura et al. .................. 257/766 |
| 5,360,991 | 11/1994 | Abys et al. .................. 257/666 |
| 5,436,082 | 7/1995 | Mathew .................. 257/673 |

FOREIGN PATENT DOCUMENTS

| | | |
|---|---|---|
| 0250146A1 | 6/1987 | European Pat. Off. . |
| 0335608A2 | 2/1989 | European Pat. Off. . |
| 0384586A2 | 1/1990 | European Pat. Off. . |
| 60-15678 | 4/1992 | Japan . |

*Primary Examiner*—Carl W. Whitehead, Jr.
*Attorney, Agent, or Firm*—Hickman Beyer & Weaver

[57] ABSTRACT

A solderable lead frame is disclosed which includes a copper base lead frame containing a one layer or plated tin or tin alloy and another layer of plated palladium. The tin plating covers only external portions of the leads, whereas the palladium covers the external regions including the tin plating, and extends into internal portions of the lead frame. A diffusion barrier, of cobalt or nickel, is provided on the base lead frame beneath the tin plating.

16 Claims, 7 Drawing Sheets

SOLDERABLE INTERGRATED CIRCUIT LEAD FRAMES PLATED WITH TIN AND PALLADIUM

This is a continuation of application Ser. No. 08/413,185 filed Mar. 30, 1995 now abandoned which is a divisional of application Ser. No. 08/260,712 filed Jun. 16, 1994 now U.S. Pat. No. 5,454,929.

BACKGROUND OF THE INVENTION

The present invention relates generally to the manufacture of integrated circuit lead frames. More particularly, it relates to a process for coating these lead frames to enhance the bonding of their internal leads to bonding wires connected to an integrated circuit (IC) and the solderability of their external leads to a circuit board.

Lead frames are the standard means for connecting a microscopic integrated circuit to outside circuitry and are usually made of copper. Typically, a die or chip containing the integrated circuit is attached to a bonding pad of a lead frame. Once the chip is attached, wires are bonded to input/output pads of the integrated circuit and to internal leads of the lead frame. This arrangement of a chip, a lead frame, and bonding wires is then encapsulated in a plastic casing leaving external leads of the lead frame exposed (outside of the plastic casing). The packaged integrated circuit can then be connected to other electronic components on a conventional circuit board by its external leads.

Integrated circuits have a multitude of uses. The packaged IC's themselves and the macroscopic circuit boards in which they are soldered are mass produced. Therefore, improvements in the manufacture and processing of the components of the packaged IC can have broad implications.

Lead frames plated with solder can have distinct advantages over unplated ones. By providing the solder directly on the lead frame, soldering of the leads to circuit boards is more reliable. Similarly, the process of bonding wires to the internal leads can be improved by plating the bonding areas of the internal leads with appropriate materials.

One lead frame technology has been described in European Patent Application 89302939.7 and is diagrammed in FIG. 1. This process 200 starts with lead frames being payed out 202 by a reel. Subsequently, they are degreased and cleaned at a step 204. After a simple washing, they are electrocleaned in a caustic alkaline solution. By then bathing the frame in a pickling acid, the base solution is neutralized, non-bound copper is removed, and a rough clean surface suitable for plating is formed. Finally, the lead frame is rinsed before plating.

The clean base frame is then plated overall with nickel at a step 206 by a conventional flood plating process. The initial nickel plating is followed by a palladium/nickel coating step 208. This in turn is followed by a nickel flood plating at a step 210 and then a palladium flood plating at a step 212 resulting in a lead frame having four coatings over the entire base copper frame. To complete the processing, the lead frames are cleaned, rinsed, and dried 214 before finally being wound 216 on a take-up reel.

A variation of this four-layer process is described in European Patent Application 90300934.8. In that process, a two-layer lead frame is made by first applying nickel and then palladium. A further variation is described in U.S. Pat. 4,628,165. In that process, a three-layer frame is formed by plating with nickel, followed by palladium/nickel, followed by palladium.

The above palladium layer approaches have been promoted as having good manufacturability. However, the solderability of the external leads of the processed frames, the primary reason for pre-plating, is quite questionable unless very corrosive fluxes are used. Texas Instruments has attempted the cumbersome technique outlined in European Patent Application 90300934.8 of dipping in or plating with a tin/lead alloy to enhance solderability. This step is performed after the lead frames have been cut from the reel into strips, assembled as strips of IC devices, then hung on racks and dipped or plated with tin/lead. It is known in the art as a cut-strip plating process. Thus, this post-plating of tin/lead is not part of the continuous process and suffers from the disadvantages inherent therein.

A state of the art technique for pre-plating lead frames is the Dyna-Craft PPF-3000, pro-plated frame, technology. An early version of PPF-3000 is described in U.S. Pat. 4,486,511. One version of PPF-3000 utilizes tin/lead platings on a copper lead frame base. A flow chart of the PPF-3000 manufacturing process 220 is shown in FIG. 2.

In this process, as in most continuos processes, lead frames undergo much of their processing in reel to reel form. After being payed out at step 222 by a reel, they must be degreased and cleaned at a step 224 just as in step 204 of the process described in FIG. 1. The clean base frame is then plated overall 226 with a nickel coating of about 30 to 60 microinches. This layer serves as a diffusion barrier to prevent diffusion of the copper in the lead frame base into a subsequently applied tin layer. Copper is known to rapidly diffuse into tin and tin alloys at standard integrated circuit packaging temperatures and thereby degrade solderability.

Copper is subsequently spot plated in step 228 on the inner leads and die attach pad over the coat of nickel by a spot plating. Spot plating technology for lead frames appears in the three U.S. Pat. Nos. 4,405,432, 4,404,079 and 4,404,080. Next, silver is spot plated 230 to aid the bonding of wires from the chip and improve the electrical conductivity and bondability at the wire bond junctions. The copper plating acts as a metallic glue to attach the silver to the nickel and to enhance the adhesion of the plastic encapsulation to the lead frame. To improve solderability to external circuitry, a tin/lead compound is spot plated 232 on the external leads. The finished pre-plated frame is then rinsed and dried 234 and finally wound 236 onto a take-up reel.

Although PPF-3000 represented a major advance in simplified IC packaging technology, and PPF-3000 frames sail through all solderability tests, the process has a few drawbacks. For example, its multiple spot platings 228, 230, and 232 are equipment intensive and may require frequent adjustments and careful positional alignment of the locations of the edges or boundaries of the plated spots (sometimes referred to as registration requirements) of the processing apparatus.

Also, a visible boundary of the tin/lead coat must be covered by the plastic encapsulation for cosmetic reasons. However, the tin/lead coat cannot reside too far inside the encapsulation, specifically within the areas where wirebonding will occur. Otherwise, the tin/lead may contaminate and disturb the delicate metallurgy of the wirebond to lead frame contact welds, rendering them unreliable. Therefore, a light registration requirement is created for the tin/lead boundary to lie inside of the plastic encapsulation, primarily a cosmetic concern, yet far enough away from the wirebonding areas so as not to contaminate them. Many perfectly functioning packaged integrated circuits are discarded for merely failing the cosmetic requirement by having a visibly exposed tin/lead boundary.

A new method for preparing solderable lead improving on the manufacturability of PPF-3000, while simultaneously overcoming the inherent solderability problems of the TI manufacturing scheme would be a great advance. Namely, the new method should be a continuous pre-plating process having good manufacturability. It should create lead frames without the cosmetic requirements of PPF-3000, provide good solderability of the external leads without the use of highly corrosive fluxes, and permit easy ultrasonic welding of bonding wires to the internal leads. This method should also be flexible enough to incorporate the use of Lead-free eletroplateable solders to permit removal of lead from the manufacturing process and the finished lead frames.

SUMMARY OF THE INVENTION

To achieve the foregoing and in accordance with the purpose of the present invention, a method for preparing a solderable lead frame having several leads is disclosed including the steps of first tin plating the leads of a base lead frame and then palladium plating all or a portion of the base lead frame after the tin plating. Preferably, both steps are performed as part of the same continuous process. The tin plating step forms tin-plated regions on the external leads of the base lead frame and is preferably performed in a spot plating reactor. The palladium plating step coats the tin-plated portions and is preferably performed in a flood plating reactor. In a preferred embodiment, the tin plating can include a tin alloy having a eutectic point between about 180 to 300 degrees centigrade. Examples of such alloys include tin alloyed with one or more of antimony, arsenic, bismuth, cadmium, gallium, gold, indium, iridium, lead, platinum, rhodium, ruthenium, silver, thallium, or zinc although other alloys are possible. In a further preferred embodiment, the tin or tin alloy is deposited only on the external leads of the base lead frame. In a still further preferred embodiment, a step of plating the base lead frame with a diffusion barrier occurs before the tin plating step such that the base lead frame material is prevented from diffusing into the tin. If the base lead frame material contains copper, the diffusion barrier preferably contains cobalt or nickel.

In an aspect of the invention, a solderable lead frame having several leads is disclosed. Each lead possesses an internal region toward the center of the frame, closer to the die attach pad, and an external region away from the center of the frame. The solderable lead frame includes a base lead frame, a layer of tin or tin alloy, and a layer of palladium. The layer of tin or tin alloy coats the external regions of the leads and forms a boundary between the internal and external regions. The layer of palladium coats the tin-plated external leads, the boundary, and a part of the base lead frame. In a preferred embodiment, there is a diffusion barrier beneath the layer of tin or tin alloy. If the base lead frame material contains copper, the diffusion barrier preferably contains cobalt or nickel. The solderable lead frame preferably satisfies the MilSpec 883 solderability standard.

In another aspect of the invention, a packaged integrated circuit is disclosed including a solderable lead frame, an integrated circuit die, several bonding wires connecting the lead frame to the integrated circuit die, and an outer molding. The solderable lead frame has a layer of tin or tin alloy on its external regions and a layer of palladium on both its internal and external regions. The solderable lead frame of the packaged IC also preferably includes a diffusion barrier which prevents the base lead frame material from diffusing into the tin or tin alloy.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 3:
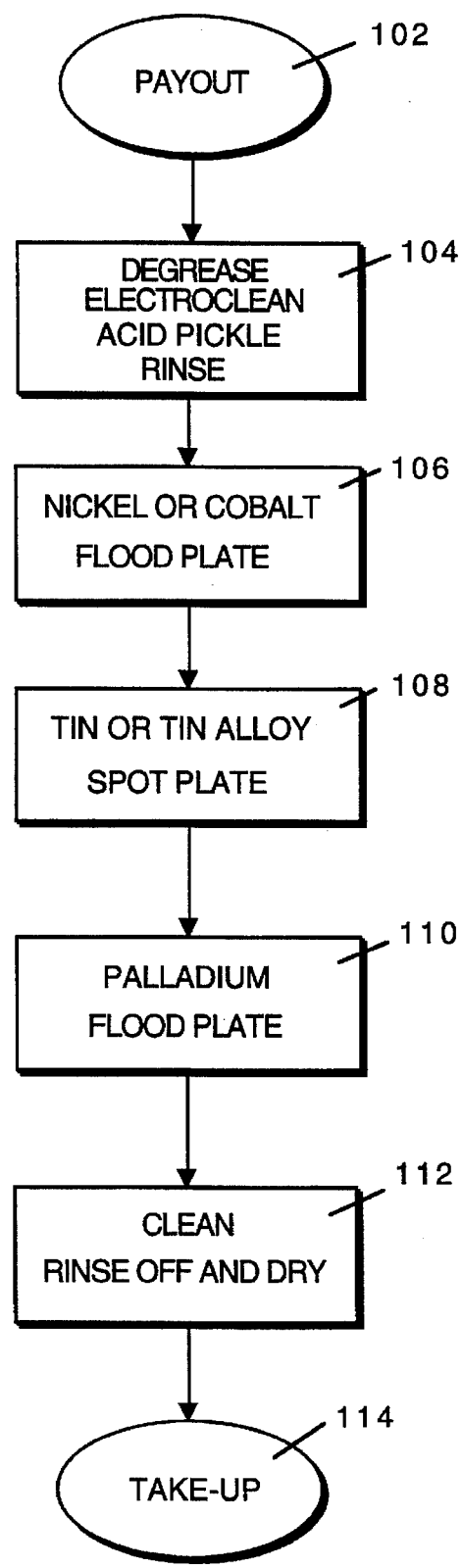
FIG. 3 is a flowchart of a preferred embodiment of the process of the present invention of preparing a solderable lead frame by pre-plating with the following layers: a diffusion barrier of cobalt or nickel, tin or tin alloy, and palladium.

FIG. 3 shows a flowchart of a preferred embodiment of the continuous pre-plating process 100 of the present invention. Initially, a continuous lead frame ribbon, stamped or etched out of a copper base material, is payed out 102 from a lead frame reel. It must be degreased and cleaned in step 104 to remove a thin oil coat of stamping oils, antioxidants, and/or remnants of the photoresist. After a simple washing, the frames are connected to a direct current source and electrocleaned by immersion in caustic materials such as caustic soda, potash, soda ash and surfactant solutions. Hydrogen formed during the electrochemical reaction acts as a scrubbing agent and reduces copper oxides. By then bathing the frame in an acid pickling solution after rinsing, any adherent electrocleaning solution is neutralized, non-metallurgically bound base materials are removed, and a microscopically rough surface suitable for plating is formed. Finally, the lead frame is rinsed before plating.

Although a base lead frame material will typically consist of solid copper or copper alloy, it need not. Indeed, the typical base lead frame may be formed from another substance such as alloy 42 or kovar and suitably prepared for plating. The preferred method of preparation is to coat these other substances with several microinches of copper or copper alloy to form copper surfaces. By describing base lead frames as substantially of copper, it is meant to include the case of a base frame having an exposed copper surface as well as those base frames whose primary or sole element is copper or a copper alloy. For illustrative purposes, only substantially copper base lead frames will be described below.

After preparation for plating, an electroplated or clad plated layer which serves as a diffusion barrier layer is applied 106 in a flood plating reaction chamber. Flood plating is a relatively simple process used to apply a coating over an entire lead frame. Flood plating will be described in more detail during the discussion of FIG. 4 below. It is understood that the diffusion barrier layer does not have to be applied at this stage, it in fact may have been previously clad to the base frame at an earlier point in the base frame manufacturing process.

It should be noted that the spot plating reactors described herein hold the lead frame ribbon in place between masks for a defined length of time while the spot is being plated, then release the lead frame ribbon, and the process controllers advance the ribbon to the next group of spots to be plated, where the process repeats. This is known as "step-and-repeat operation. The flood plating reactors, however, can operate simultaneously with or without the lead frame ribbon being held in place during plating. Other readily available spot plating reactors are designed to operate without holding the lead frame ribbon in place for defined lengths of time. When operating the flood plating reactors continuously, and the spot plating reactors in step-and-repeat fashion, the lead frame ribbon is allowed to accumulate in between reactors.

Cobalt, nickel and cobalt/nickel alloys are examples of suitable diffusion barriers used in step 106. They dramatically reduce the extensive diffusion of the copper of the base lead frame material into a tin or tin alloy layer which is later applied. Nickel also prevents the diffusion of iron from a kovar base lead frame material into the tin or tin alloy layer. Particularly at the temperatures used for curing adhesives used to attach an integrated circuit die to a bonding pad area of the lead frame, copper quickly diffuses into tin and forms copper/tin alloys via a solid state chemical reaction. This accumulation of copper/tin alloys at an interface of the base frame with the tin degrades solderability and defeats much of the purpose of pre-plating. An appropriate thickness of a nickel or cobalt diffusion barrier is about 15 to 100 microinches with a preferred range of about 30 to 60 microinches. The layer must be thick enough to effectively reduce the diffusion of the copper into tin to maintain solderability of the tin. Because of this solderability requirement, the lower limit is partially dependent upon the amount of tin or tin alloy applied at a later stage. Upper thickness limits depend partly on the spacing between the leads and on the size of spacings and openings of the lead frame. Additionally, excessively thick diffusion barrier layers may crack upon bending of the leads thereby reducing their effectiveness.

After the application of the diffusion barrier, the base lead frame is fed or drawn into a spot plating reaction chamber to perform plating step 108. A spot plating reaction chamber is a particular type of step-and-repeat electroplating reactor so named because it divides a continuous process into repeated static steps as described above. Each step-and-repeat process requires relatively precise alignment of a mask to the lead frame. Spot plating will be described in more detail during the discussion of FIG. 5 below.

State of the art preplating technologies, such as the PPF-3000 process 220, use spot plating. However, their use of spot plating is restricted by registration requirements defining alignment tolerances between the spot plating apparatus and portions the lead frames. These registration requirements are partly dictated by the need to align successive spot platings. They are also dictated by the desire to cover the boundaries of plated portions with integrated circuit packaging material during final assembly of the packaged IC.

Only one step-and-repeat reaction chamber, that used in step 108, is required in the process of the invention 100 unlike the three steps 228, 230, and 232 used in PPF-3000. The tolerances arising solely from the alignment of the spot plating apparatus with the lead frames will thus be minimized. Additionally, since a single spot plating step 108 occurs in the process of the invention 100, the added restriction of electroplating boundary encroachment of successive spot platings will be completely eliminated. Together, these advantages afford a much higher degree of manufacturability of the processed lead frames. A subsequent palladium plating step will obviate the primarily cosmetic tin/lead registration requirement related to the final IC packaging.

In the spot plating reaction chamber, tin or tin alloy is selectively deposited in step 108 onto an external region of the lead frame away from the center of the frame. If all of the external leads are coated, the edge of the applied tin or tin alloy essentially defines a boundary between the external and internal regions of the lead frame. A thickness of tin commensurate with good solderability of the external leads is about 50 to 500 microinches with a preferred range of about 300 to 500 microinches. The spacing between leads and the bending of the external leads, along with the economic concerns over the time and materials required to plate unnecessary thick layers place upper limits on the thickness of the tin.

Various electrolytes and processing conditions can be employed to plate the tin layers of this invention. For example, the electrolyte could contain salts of tin and salts of desired alloying elements in concentrations necessary to provide a desired alloy composition. The low reflow temperature of tin/lead solder of 183 degrees centigrade slows the curing process thus limiting the variety of adhesives for bonding the die to the pad. Therefore, alloys of tin having high eutectic points between 180 and 300 degrees centigrade are particularly desirable. Such alloys can be obtained when tin is alloyed with one or more of antimony, arsenic, bismuth, cadmium, gallium, gold, indium, iridium, lead, platinum, rhodium, ruthenium, silver, thallium, or zinc. Of course, other tin alloys may also be used.

Further referring to FIG. 3, the base lead frame (which is now partially coated with tin or tin alloy) is passed into a second flood plating reaction chamber during step 110 There the frame receives an overall coat of palladium while still on the lead frame ribbon and as part of the same continuous plating process 100. This palladium layer covers the tin coated portions and the boundary. The palladium layer should be between about 2 to 20 microinches thick with a preferred range of about 3 to 6 microinches.

Those of skill in the art will appreciate that each electroplating step (i.e., diffusion barrier plating 106, tin/tin alloy plating 108, and palladium plating 110) can be conducted under many different conditions. For example, by varying the electrolyte composition, current density, lead frame residence time in the reactor, anode configuration, temperature, etc., the thickness and conditions of the coating can be controlled. The principles underlying those electroplating steps are described in standard treatises such as *Electroplating* by Lowenheim which is incorporated herein by reference for all purposes. It should be understood that the present invention is directed to a sequence of process steps and to the products of those process steps.

The final steps 112 of the continuous pre-plating process 100 of the present invention are cleaning, rinsing, and drying the finished solderable lead frame. The lead frame is then wound 114 onto a take-up reel. Although the more efficient continuous reel method has been emphasized, the same flood and spot plating steps 106, 108, and 110 can be performed on individual lead frames or cut strips of lead frames moved from reactor to reactor.

Figure 4:
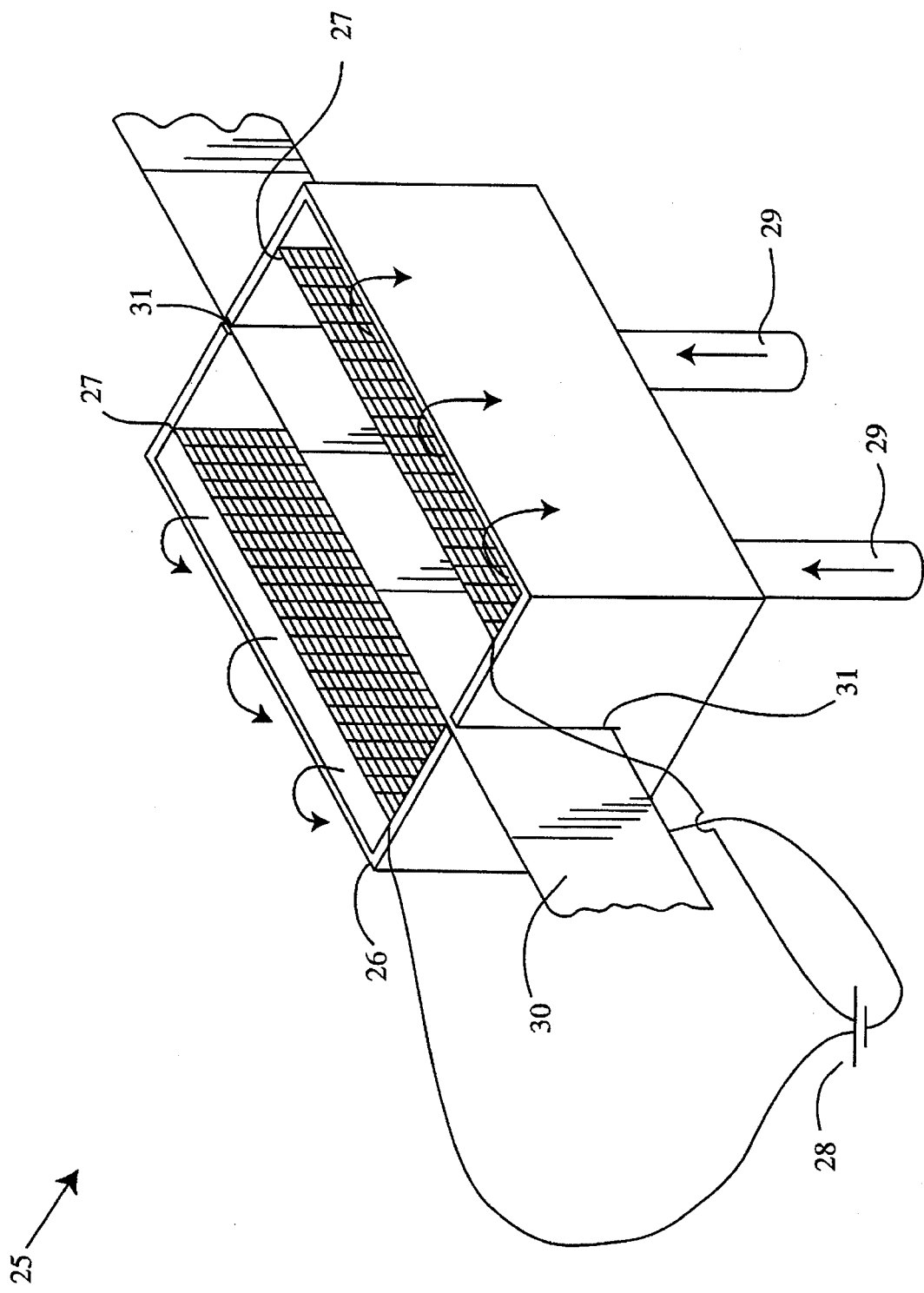
FIG. 4 is a diagrammatic representation of a flood plating reaction chamber.

FIG. 4 is a diagrammatic representation of an exemplary flood plating reaction chamber or reactor 25. A tub 26 contains anodes 27 immersed in an electrolyte. The anodes 27 are typically either wire screens or baskets. An anode screen is generally titanium or platinized titanium. An anode basket is generally made of a titanium screen and contains chunks of the metal, such as nickel or palladium, which will be deposited. The anodes are connected to a pulsed or direct current source 28.

Feed tubes 29 permit the electrolyte to be pumped into the tub 26 as indicated by the arrows. This pumping causes electrolyte to overflow as indicated by the arrows. The overflowing electrolyte will be captured by a reservoir (not shown) beneath the tub 26 and pumped through feed tubes 29 back into the tub 26.

A lead frame ribbon 30 is made cathodic by a connection to the pulsed or direct current source 28 and passed through the tub 26. This results in electrodeposition. Slits 31 may contain gaskets to prevent overflow of electrolyte through the slits 31. Clearly, many variations of the flood plating reactor 25 are possible.

Metal ions from the electrolyte are deposited as metal layers onto the ribbon 30 by electrodeposition. Of course, the electrolytes used to plate different metals (e.g., cobalt/ nickel as opposed to palladium) are different although the flood plating apparatus are generally similar. In the process of the invention 100, flood plating is performed in the diffusion barrier and palladium platings, invention steps 106 and 110.

Figure 5:
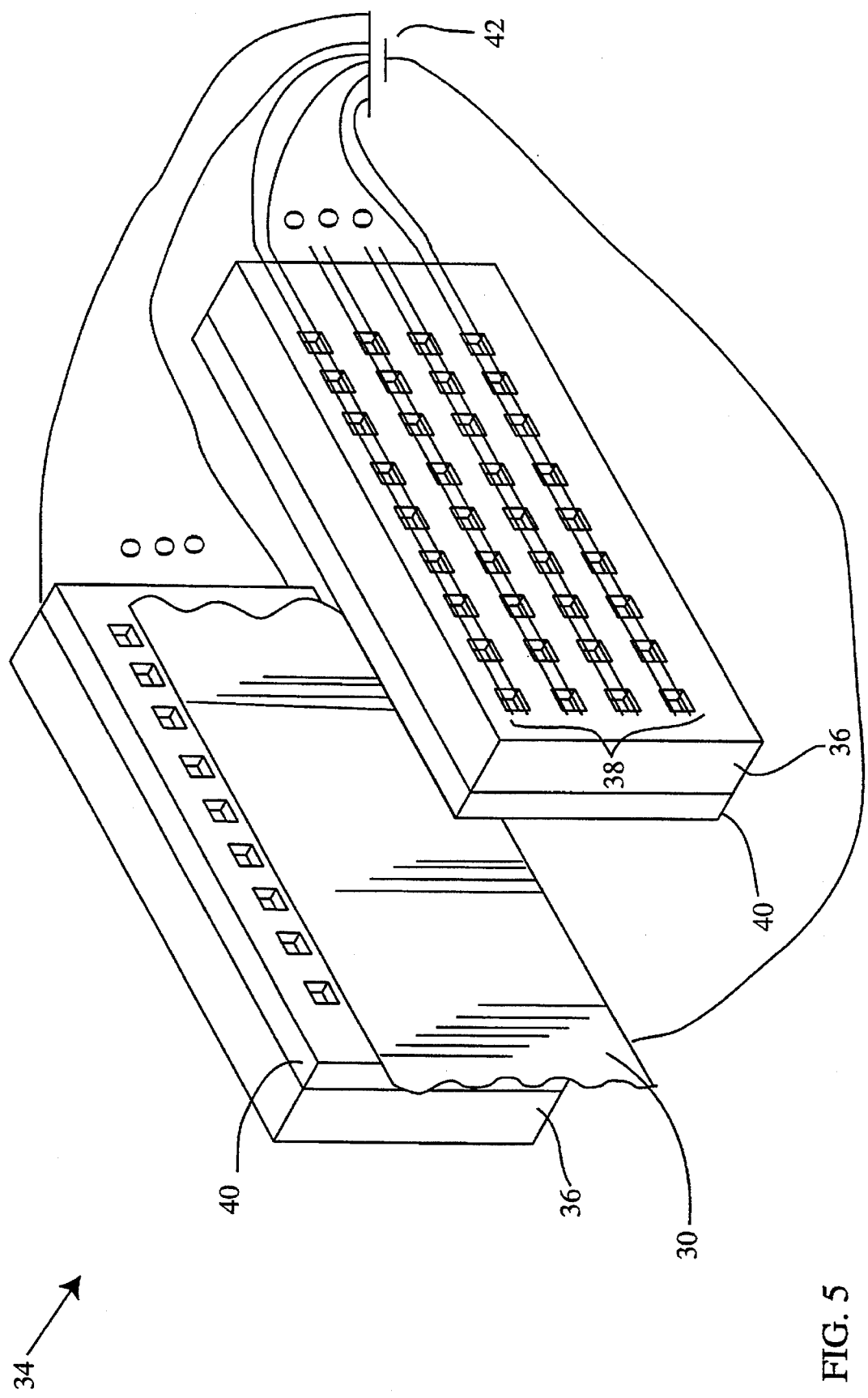
FIG. 5 is a diagrammatic representation of a spot plating reaction chamber.

The same principles of plating are used in the spot plating reaction chamber or reactor 34 represented in FIG. 5. However, the plating regions are limited to certain "spots" on the lead frame. Inert perforated shells 36 hold several anode wires 38. These shells 36 have resilient inert faces 40 usually made from silicone. A pulsed or direct current source 42 is connected to these anode wires and lead frame ribbon 30. The lead frame ribbon 30 is clamped between the inert shells 36. Electroplating solution is jetted through the perforations in the shells 36 onto the ribbon 30 via a suitable pumping mechanism. In this way, the resilient faces 40 mask off areas of the ribbon where plating is not desired. But, the silicone rubber faces 40 only allow those portions of the lead frame exposed by the holes to react with the electrolyte. In the process of the invention 100, the tin spot plating step 108 selectively plates external leads of lead frames via this masking procedure as taught by the Kosowsky patent, U.S. Pat. No. 4,405,432.

Figure 6:
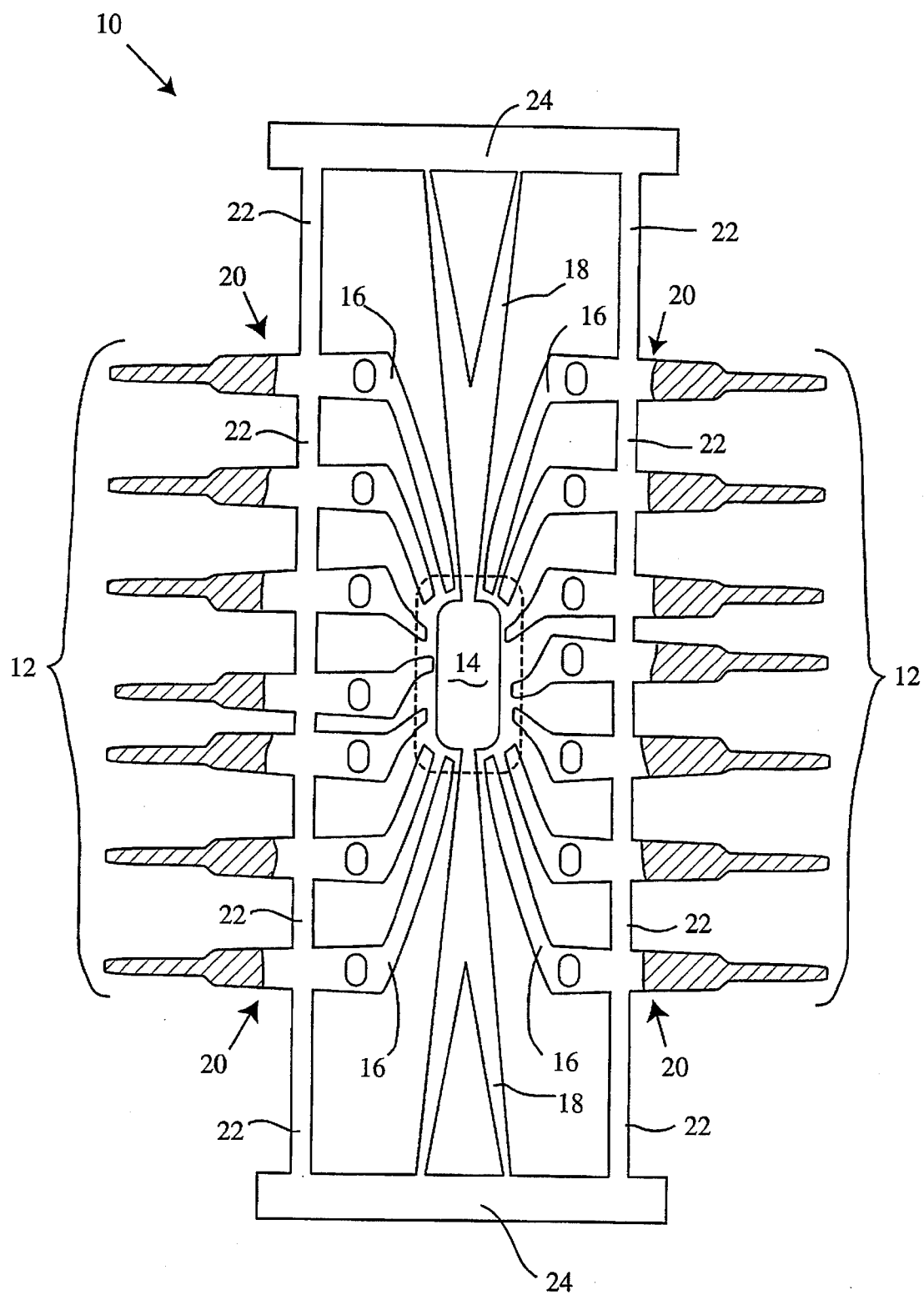
FIG. 6 is a top view of a conventional lead frame having internal and external regions.

The lead frames produced by the process of the present invention will now be described in more detail. FIG. 6 shows a top view of a conventional copper base lead frame 10 after intermediate invention step 108. After being payed out from a reel in step 102, the entire base frame 10 is flood plated during step 106 with a diffusion barrier of cobalt or nickel. The external regions including the external leads 12 are then spot plated 108 with tin or tin alloy to enhance their solderability to external circuitry. This spot plating does not coat the die attach pad 14, nearby portions of the internal leads 16, or the inner portions of the fishtails 18 supporting the die attach pad 14. A critical region containing the die attach pad 14 where tin should not reside is outlined in a dashed line in FIG. 6. Bonding wires will eventually be ultrasonically welded to the portions of the internal leads 16 which are near the die attach pad 14. It is undesirable to have even residual amounts of tin on areas where the wires will be bonded because non-precious metals are generally regarded as contaminants in wire bonding areas. This "partial" or "spot" plating of the frame will leave a boundary 20 which generally defines the boundary between internal and external regions subsequent to the formation of the tin coated portions. The entire base frame 10 is finally coated in invention step 110 with a layer of palladium to cover the tin-plated portions of the external leads 12, the boundary 20, and the areas not plated with tin. Thereafter, the finished solderable pre-plated lead frame is cleansed, rinsed, dried, and gathered up on a take-up reel in the final processing steps 112 and 114.

In FIG. 6, there are fourteen external leads 12 and fourteen internal leads 16. Each external lead has a corresponding internal lead. Dam bars 22 interconnecting the individual leads are eventually removed during packaging of the chip. Rails 24 touch sliding contacts supplying pulsed or direct current during the various plating stages. This electric connection through the rails 24 makes the lead frame ribbon 30 cathodic in the flood and spot reactors represented in FIGS. 4 and 5. The rails 24 are also eventually removed during IC packaging.

Figure 7:
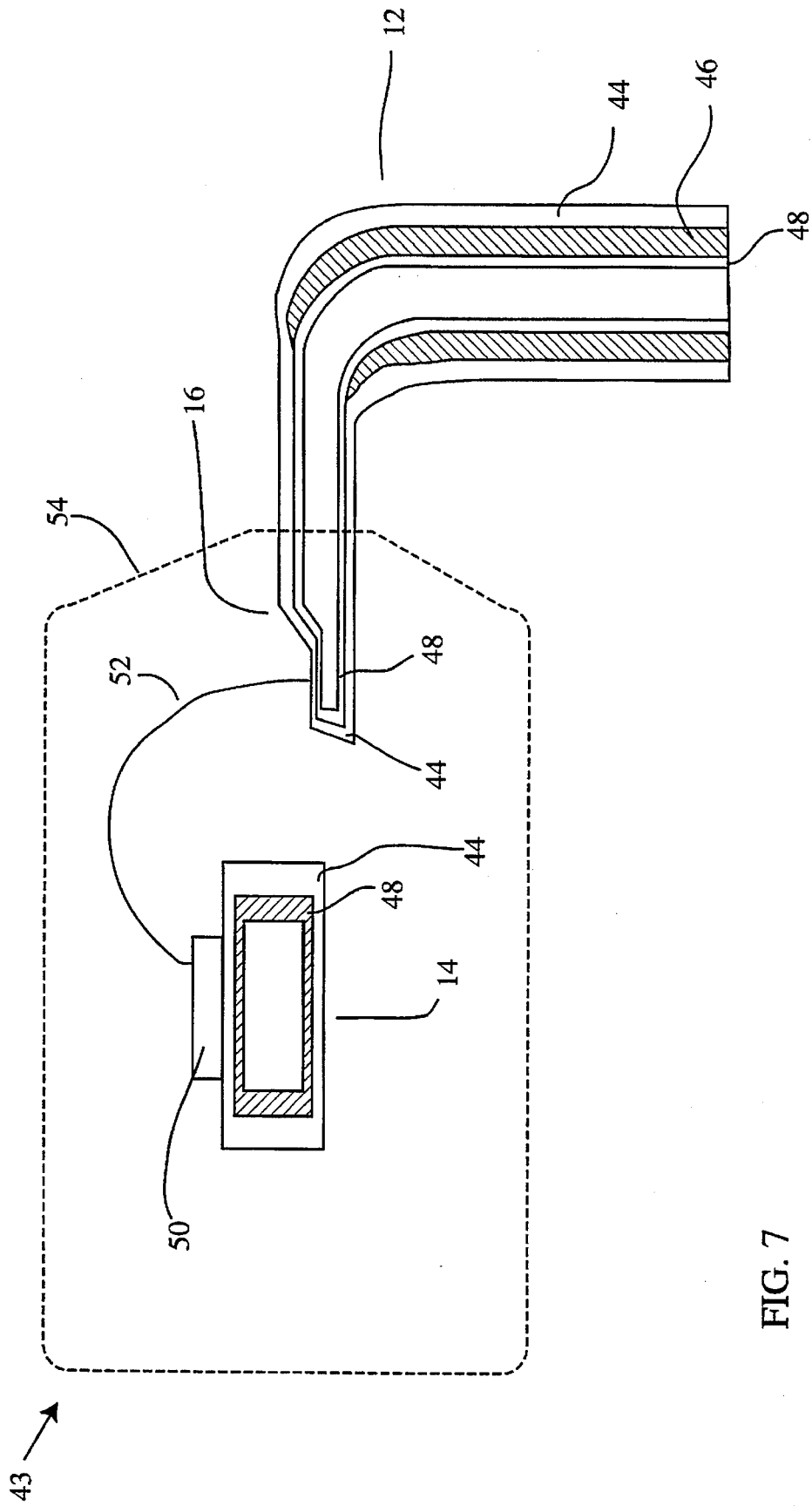
FIG. 7 is a diagrammatic cross-sectional side view of a packaged integrated circuit utilizing a lead frame pre-plated in accordance with the present invention.

Referring now to FIG. 7, a side cross section of a packaged integrated circuit 43 using a solderable lead frame of the present invention is shown. (FIG. 6 is a top view of the lead frame 10.) A lead having an external lead 12 and an internal lead 16 is shown. The external lead 12 and internal lead 16 share an outer layer of palladium 44. The external lead 12 also has a layer of tin or tin alloy 46 immediately beneath the palladium layer 44. A cobalt or nickel diffusion barrier 48 coats both the internal lead 16 and the external lead 12. The die attach pad 14 has a base plating of the diffusion barrier 48 and an outer plating of palladium 44. An integrated circuit die is electrically connected to the internal lead 16 by a bonding wire 52. An outer molding 54 encases the solderable lead frame 10, the die 50, and bonding wires 52.

Figure 1:
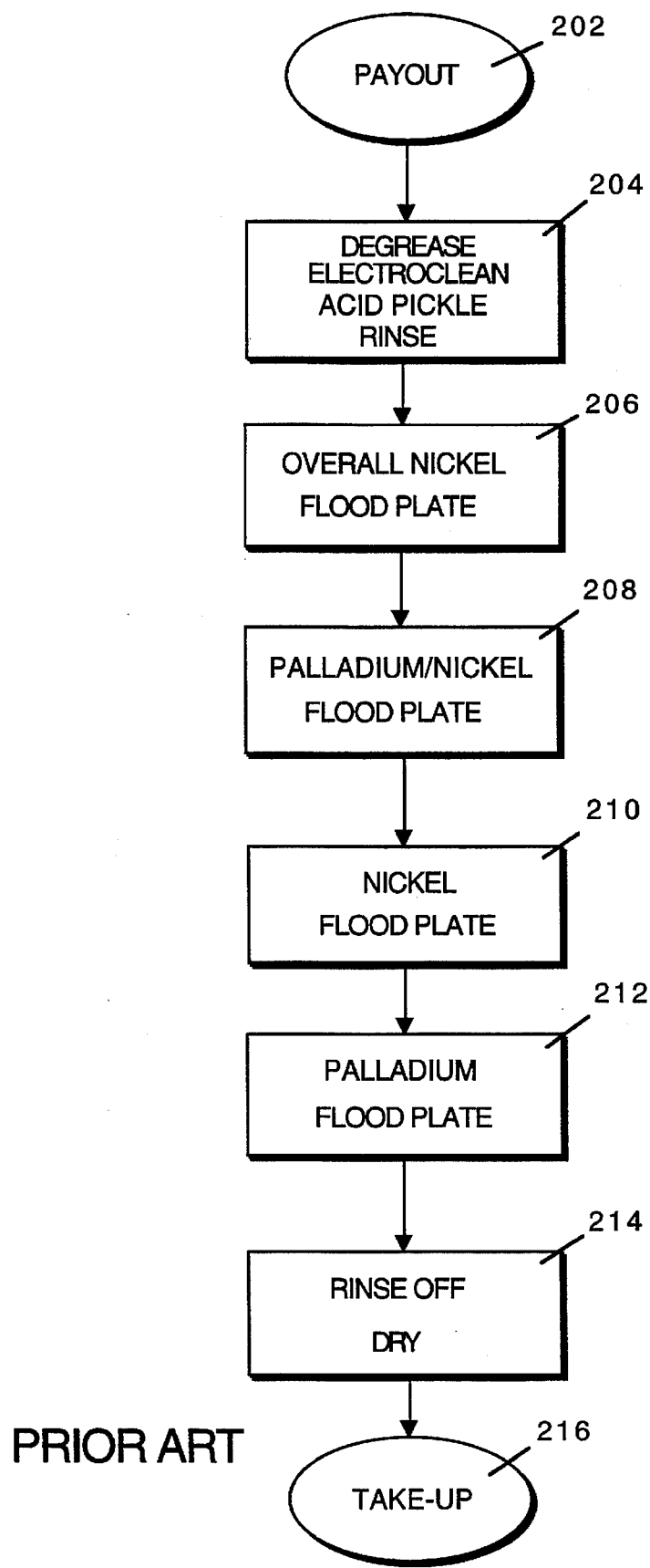
FIG. 1 is a flowchart of a conventional four layer process for making palladium/nickel lead frames.
Figure 2:
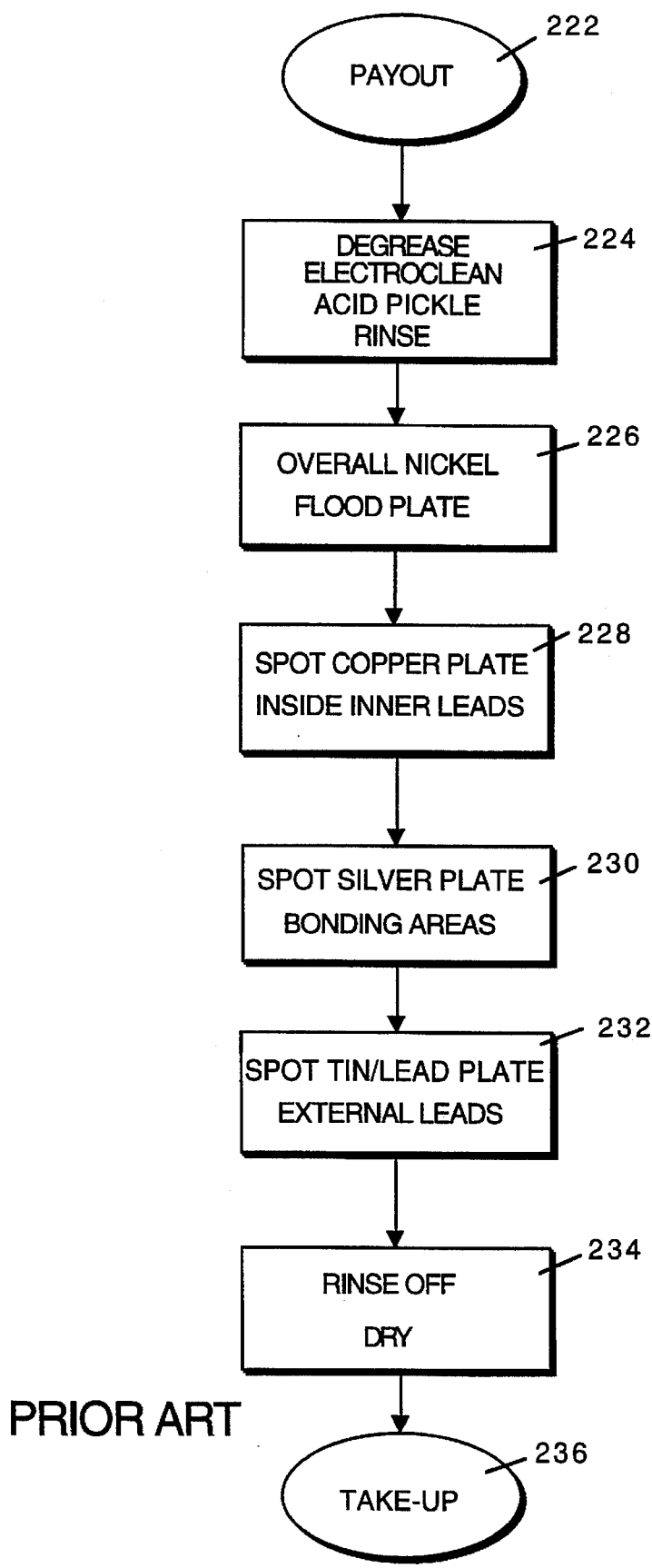
FIG. 2 is a flowchart of a conventional process for making solderable tin-containing lead frames.

Solderable lead frames created by the above-mentioned process have various advantages over their prior art counterparts. For example, the resulting frame's die attach pad area 14 and portions of internal leads 16 near the pad have no significant levels of exposed tin. Further, the entire lead frame 10 has a palladium coat 44 to provide a pleasing appearance and good wire bonding characteristics. Because the palladium coat 44 is provided on a solderable tin 46 layer, it does not create the soldering problems encountered in prior art palladium plating processes such as the process shown in FIG. 1 and its variants. Specifically, the palladium coat 44 is thin enough to allow solderability of the external leads sufficient to satisfy the MilSpec 883 standard without the use of highly corrosive fluxes due to the soldering activity of the tin. The palladium 44 on the external leads 12 simply fuses into the tin layer 46 upon soldering. Further, the conventional ultrasonic welding technique for bonding wires 52 to the internal leads 16 of the frame 10 will be unaffected by the thin palladium coat 44; the ultrasound will readily ram the wires into the copper. Additionally, the overall palladium coat 44 eliminates the cosmetic registration requirement of the packaged integrated circuit 43 by covering the external leads and the tin boundary 20.

Although only one embodiment of the present invention has been described, it should be understood that the present invention may be embodied in many other specific forms without departing from the spirit or scope of the invention. Particularly, not all of the external leads need to be plated with tin. Tin alloys other than those explicitly specified may be used. The tin plating may be applied to the internal leads, but it must not cover areas where the bonding wires are to be attached. Although only substantially copper base lead frames have been described in detail, other base lead frame materials such as kovar or alloy 42 may be used. Other diffusion barriers besides nickel and cobalt may also be used. The continuous pre-plating method need not use reels. Although the continuous method is preferred, it can be replaced by a discontinuous method using the same spot and flood plating steps. Additionally, the thickness ranges specified for the diffusion barrier, the tin/tin alloy layer, and the palladium layer are not absolute. Similarly, the eutectic point temperature range for the tin alloys is not comprehensive.

Finally, plating apparatus other than those described may be used, and spot plating may be performed by flood plating followed by etching or stripping portions of the substance deposited by flood plating. Therefore, the present examples are to be considered as illustrative and not restrictive, and the invention is not to be limited to the details given herein, but may be modified within the scope of the appended claims.

I claim:

1. A solderable lead frame having a multiplicity of leads, the lead frame having an internal region being disposed toward its center and an external region disposed away from its center, the lead frame comprising:
   a base lead frame made from a base lead frame material;
   a layer of tin or tin alloy coating the external region of the base lead frame, wherein the layer of tin or tin alloy has an inner edge defining a boundary between the external and internal regions of the lead frame; and
   a layer of palladium coating both the external region of the lead frame and the boundary such that the tin or tin alloy and at least a part of the base lead frame are coated with palladium, wherein said tin alloy includes tin alloyed with one or more elements chosen from a group consisting of antimony, arsenic, bismuth, cadmium, gallium, gold, indium, iridium, lead, platinum, rhodium, ruthenium, thallium, and zinc.

2. A solderable lead frame as recited in claim 1 wherein said external regions of the lead frame satisfy a solderability standard defined by MilsSpec 883.

3. A solderable lead frame as recited in claim 1 wherein said tin alloy has a eutectic point between about 180 degrees centigrade and 300 degrees centigrade.

4. A solderable lead frame as recited in claim 1 wherein said layer of tin or tin alloy is between about 50 microinches and 500 microinches thick.

5. A solderable lead frame as recited in claim 1 wherein said palladium layer is between about 2 microinches and 20 microinches in thickness.

6. A solderable lead frame as recited in claim 1 wherein said palladium layer is between about 3 microinches and 6 microinches in thickness.

7. A solderable lead frame as recited in claim 1 further comprising a diffusion barrier between said base lead frame and said layer of tin or tin alloy whereby the diffusion barrier substantially prevents said base lead frame material from diffusion into said tin or tin alloy.

8. A solderable lead frame as recited in claim 7 wherein said base lead frame contains copper and wherein said diffusion barrier includes cobalt.

9. A solderable lead frame as recited in claim 8 wherein said diffusion barrier is between 15 and 100 microinches thick.

10. A solderable lead frame as recited in claim 8 wherein said diffusion barrier is between 30 and 60 microinches thick.

11. A solderable lead frame as recited in claim 7 wherein said base lead frame contains copper and wherein said diffusion barrier includes nickel.

12. A solderable lead frame as recited in claim 11 wherein said diffusion barrier is between 15 and 100 microinches thick.

13. A solderable lead frame as recited in claim 11 wherein said diffusion barrier is between 30 and 60 microinches thick.

14. A packaged integrated circuit comprising:
   a solderable lead frame having a multiplicity of leads, an internal region disposed toward the center of the lead frame and an external region disposed away from the center of the lead frame, the lead frame also comprising a base lead frame made from a base lead frame material, a layer of tin or tin alloy coating the external region of the lead frame, wherein said layer of tin or tin alloy has an inner edge defining a boundary between the external and internal regions of the lead frame and whereby solderability of the external leads coated with tin or tin alloy is enhanced, and a layer of palladium coating both the external region and the boundary such that at least a portion of the base lead frame and the tin or tin alloy are coated with palladium;
   an integrated circuit die;
   a plurality of bonding wires electrically connecting the internal regions of the leads to the integrated circuit die; and
   an outer molding encasing the solderable lead frame, the die and the bonding wires such that the external regions of the leads are exposed, wherein said tin alloy includes tin alloyed with one or more elements chosen from a group consisting of antimony, arsenic, bismuth, cadmium, gallium, gold, indium, iridium, lead, platinum, rhodium, ruthenium, thallium, and zinc.

15. A packaged integrated circuit as in claim 14 further comprising a diffusion barrier residing between said base lead frame and said layer of tin or tin alloy, whereby the diffusion barrier substantially prevents said base lead frame material from diffusing into said tin or tin alloy.

16. A packaged integrated circuit as in claim 15 wherein said base lead frame material contains copper and wherein said diffusion barrier contains cobalt or nickel.

* * * * *